United States Patent
Mitric et al.

(10) Patent No.: US 10,992,301 B1
(45) Date of Patent: Apr. 27, 2021

(54) CIRCUIT AND METHOD FOR GENERATING TEMPERATURE-STABLE CLOCKS USING ORDINARY OSCILLATORS

(71) Applicant: Microsemi Semiconductor ULC, Kanata (CA)

(72) Inventors: Krste Mitric, Ottawa (CA); Kamran Rahbar, Kanata (CA)

(73) Assignee: Microsemi Semiconductor ULC, Kanata (CA)

( * ) Notice: Subject to any disclaimer, the term of this patent is extended or adjusted under 35 U.S.C. 154(b) by 0 days.

(21) Appl. No.: 16/816,113

(22) Filed: Mar. 11, 2020

Related U.S. Application Data

(60) Provisional application No. 62/959,074, filed on Jan. 9, 2020.

(51) Int. Cl.
| | |
|---|---|
| *H03L 7/087* | (2006.01) |
| *H03L 7/07* | (2006.01) |
| *H03L 7/099* | (2006.01) |

(52) U.S. Cl.
CPC ............. *H03L 7/087* (2013.01); *H03L 7/07* (2013.01); *H03L 7/0994* (2013.01); *H03L 2207/50* (2013.01)

(58) Field of Classification Search
CPC ..... H03L 7/06; H03L 7/07; H03L 7/08; H03L 7/085; H03L 7/087; H03L 7/099; H03L 7/0991; H03L 7/0994; H03L 2007/50
See application file for complete search history.

(56) References Cited

U.S. PATENT DOCUMENTS

| | | | |
|---|---|---|---|
| 6,359,476 B2 | 3/2002 | Hartman et al. | |
| 7,126,429 B2 | 10/2006 | Mitric | |
| 7,148,753 B1 * | 12/2006 | Garlepp | ............... H03L 7/07 |
| | | | 331/2 |
| 7,242,740 B2 | 7/2007 | Spijker et al. | |
| 7,548,119 B2 | 6/2009 | Mitric et al. | |
| 8,010,355 B2 | 8/2011 | Rahbar | |
| 8,023,641 B2 | 9/2011 | Rahbar | |
| 8,090,316 B2 | 1/2012 | Milijevic et al. | |
| 8,335,319 B2 | 12/2012 | Rahbar | |
| 8,483,244 B2 | 7/2013 | Rahbar | |

(Continued)

FOREIGN PATENT DOCUMENTS

CN     103684256 A     3/2014

*Primary Examiner* — Diana J. Cheng
(74) *Attorney, Agent, or Firm* — Glass and Associates; Kenneth Glass; Kenneth D'Alessandro

(57) ABSTRACT

A circuit for generating temperature-stable clocks including first and second crystal oscillators, an input for a reference clock source, a clock output, a first phase acquisition circuit coupled to the first and second crystal oscillators, a second phase acquisition circuit coupled to the input for the reference clock source and to the second crystal oscillator, a first DPLL coupled to the first phase acquisition circuit, a crystal oscillator variation estimator coupled to the first DPLL, a second DPLL coupled to the second phase acquisition circuit and including a phase-frequency detector having a input coupled to the second phase acquisition circuit, a loop filter, a frequency subtractor having an input coupled to the loop filter and an input coupled to the crystal oscillator variation estimator, and a DCO coupled to the frequency subtractor and driving an input of the phase-frequency detector.

18 Claims, 2 Drawing Sheets

(56) References Cited

U.S. PATENT DOCUMENTS

Figure 1:
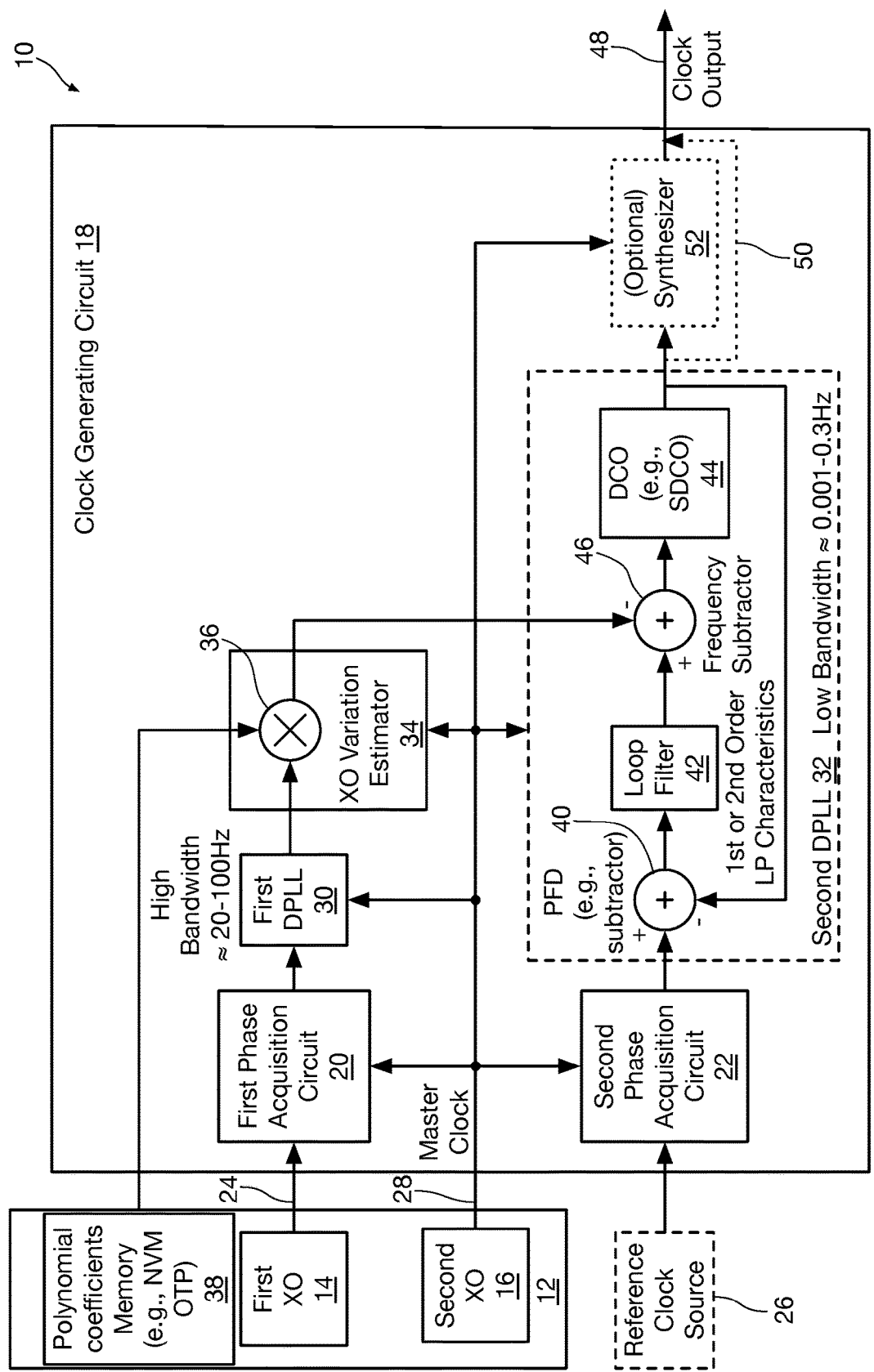

| | | |
|---|---|---|
| 8,581,670 B2 | 11/2013 | Akaike et al. |
| 8,599,986 B2 | 12/2013 | Rahbar |
| 8,774,227 B2 | 7/2014 | Rahbar |
| 8,791,734 B1 * | 7/2014 | Hara ................... H03L 7/235 |
| | | 327/156 |
| 8,907,706 B2 | 12/2014 | Mitric et al. |
| 8,957,711 B2 | 2/2015 | Jin et al. |
| 8,971,548 B2 | 3/2015 | Rahbar et al. |
| 9,444,474 B2 | 9/2016 | Rahbar et al. |
| 9,503,254 B2 | 11/2016 | Rahbar et al. |
| 9,634,675 B2 | 4/2017 | Schram et al. |
| 9,667,237 B2 | 5/2017 | Jin et al. |
| 10,007,639 B2 | 6/2018 | Mitric et al. |
| 10,069,503 B2 | 9/2018 | Zhang et al. |
| 10,187,074 B2 | 1/2019 | Shimada |
| 10,250,379 B2 | 4/2019 | Haddad et al. |
| 2011/0194438 A1 | 8/2011 | Rahbar |
| 2014/0062537 A1 * | 3/2014 | Kitsukawa ............ H03L 7/23 |
| | | 327/107 |
| 2015/0207619 A1 | 7/2015 | Schram et al. |
| 2016/0301417 A1 | 10/2016 | Mitric et al. |
| 2016/0301419 A1 | 10/2016 | Schram et al. |
| 2018/0088535 A1 | 3/2018 | Wang et al. |
| 2018/0205370 A1 | 7/2018 | Jin et al. |

* cited by examiner ations.

CIRCUIT AND METHOD FOR GENERATING TEMPERATURE-STABLE CLOCKS USING ORDINARY OSCILLATORS

REFERENCE TO RELATED APPLICATIONS

The present application claims priority to U.S. Provisional Patent Application Ser. No. 62/959,074, filed on Jan. 9, 2020, the contents of which are incorporated by reference herein in their entirety.

BACKGROUND

The present invention relates to clock generation. More particularly, the present invention relates to a circuit and method for generating temperature-stable clocks using ordinary oscillators.

Many circuit applications require stable frequency and low jitter characteristics for the clock circuit. The cost of temperature-compensated crystal oscillators (TCXO) and/or oven-controlled crystal oscillators (OCXO) that are presently required to meet such demands are high. It would therefore be advantageous to provide a solution that allows replacement of TCXO or OCXO with ordinary crystal oscillators (XO).

BRIEF DESCRIPTION

In accordance with an aspect of the invention, a circuit for generating temperature-stable clocks includes a first crystal oscillator, a second crystal oscillator, an input for a reference clock source, a clock output, a first phase acquisition circuit coupled to an output of the first crystal oscillator and to an output of the second crystal oscillator, a second phase acquisition circuit coupled to the input for the reference clock source and to an output of the second crystal oscillator, a first digital phase locked loop (DPLL) coupled to an output of the first phase acquisition circuit, a crystal oscillator variation estimator coupled to an output of the first DPLL, and a second DPLL coupled to an output of the second phase acquisition circuit, the second DPLL including: a phase-frequency detector having a first input coupled to the output of the second phase acquisition circuit, a loop filter, a frequency subtractor having a first input coupled to an output of the loop filter and a second input coupled to an output of the crystal oscillator variation estimator, and a digital controlled oscillator (DCO) coupled to an output of the frequency subtractor, an output of the DCO coupled to a second input of the phase-frequency detector and coupled to the clock output.

In accordance with an aspect of the invention, the circuit further includes a synthesizer coupled to the output of the DCO and driving the clock output.

In accordance with an aspect of the invention, the DCO is a software DCO.

In accordance with an aspect of the invention, the first crystal oscillator and the second crystal oscillator are disposed in a single package.

In accordance with an aspect of the invention, the crystal oscillator variation estimator includes a multiplier having one input coupled to the output of the first DPLL and a second input coupled to a memory storing polynomial coefficients generated during initial production and characterization of the first and second crystal oscillators obtained by curve fitting of frequency variations of the second crystal oscillator over temperature versus frequency differences between the first and second crystal oscillators.

In accordance with an aspect of the invention, the memory is one of a non-volatile memory and a one-time-programmable memory.

In accordance with an aspect of the invention, the first crystal oscillator, the second crystal oscillator, and the memory are disposed in a single package.

In accordance with an aspect of the invention, the crystal oscillator variation estimator includes a multiplier having one input coupled to the output of the first DPLL and a second input coupled to a memory storing polynomial coefficients generated during initial production and characterization of the first and second crystal oscillators obtained by curve fitting of frequency variations of the second crystal oscillator over temperature versus frequency differences between the first and second crystal oscillators.

In accordance with an aspect of the invention, the first DPLL is a high bandwidth DPLL and the second DPLL is a low bandwidth DPLL.

In accordance with an aspect of the invention, the loop filter has one of 1st and 2nd order low pass characteristics.

In accordance with an aspect of the invention, a method for generating temperature-stable clocks includes providing first and second crystal oscillators, providing a memory that stores temperature characterization polynomial coefficients generated during initial production and characterization of the first and second crystal oscillators obtained by curve fitting frequency variations of the second crystal oscillator over temperature versus frequency differences between the first and second crystal oscillators over temperature, measuring the phase difference between the first crystal oscillator and the second crystal oscillator, phase locking a high-bandwidth first digital phase locked loop (DPLL) to the measured phase difference between the first crystal oscillator and the second crystal oscillator, estimating frequency variations of the second crystal oscillator responsive to frequency information based on the measured phase difference, and responsive to the stored temperature characterization polynomial coefficients, providing a reference clock signal from a reference clock source, measuring the phase difference between the reference clock signal and the second crystal oscillator, phase locking a second DPLL to the phase difference between the reference clock signal and the second crystal oscillator, adjusting the frequency of the second DPLL by the estimated frequency variation of the second crystal oscillator, and providing an output from the second DPLL.

In accordance with an aspect of the invention, the method further includes providing the output of the second DPLL to a frequency synthesizer.

In accordance with an aspect of the invention, providing first and second crystal oscillators includes providing first and second crystal oscillators in the same package.

In accordance with an aspect of the invention, the measuring the phase difference between the first crystal oscillator and the second crystal oscillator includes measuring the phase difference between the first crystal oscillator and the second crystal oscillator in a first phase acquisition circuit.

In accordance with an aspect of the invention, the measuring the phase difference between the reference clock signal and the second crystal oscillator includes measuring the phase difference between the reference clock signal and the second crystal oscillator in a second phase acquisition circuit.

In accordance with an aspect of the invention, the adjusting the frequency of the second DPLL by the estimated frequency variation over temperature of the second crystal oscillator includes adjusting the frequency of the second DPLL using a frequency subtractor circuit.

In accordance with an aspect of the invention, providing the output of the second DPLL includes providing the output of the second DPLL from a digitally controlled oscillator in the second DPLL.

In accordance with an aspect of the invention, the method further includes providing the output of the digitally controlled oscillator to a synthesizer.

BRIEF DESCRIPTION OF THE DRAWING FIGURES

Figure 2:
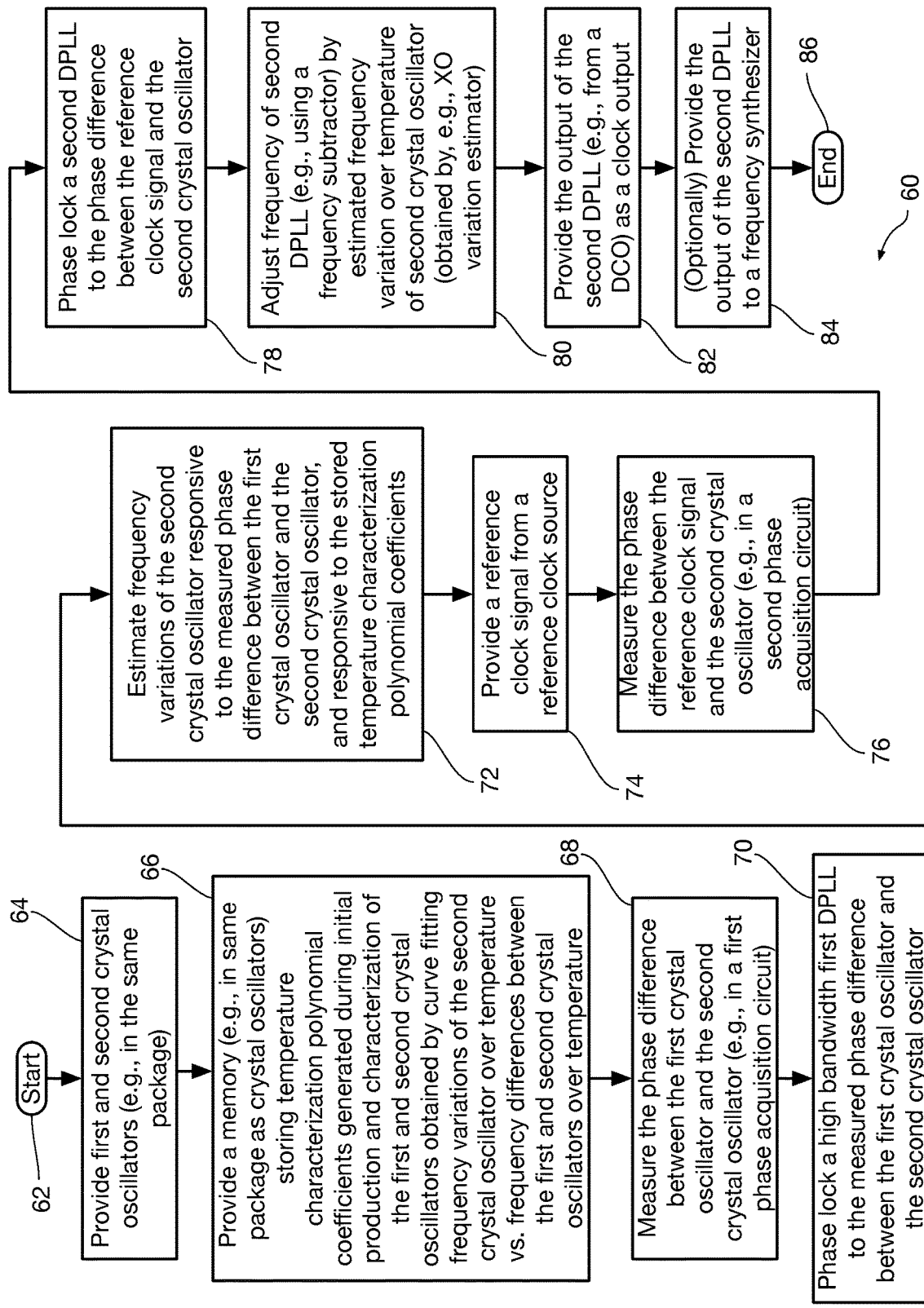

The invention will be explained in more detail in the following with reference to embodiments and to the drawing in which are shown:

FIG. 1 is a block diagram of a circuit for generating temperature-stable low jitter any-frequency clocks using ordinary oscillators in accordance with an aspect of the invention; and FIG. 2 is a flow diagram that shows an illustrative method for generating temperature-stable low jitter any-frequency clocks using ordinary oscillators in accordance with an aspect of the invention.

DETAILED DESCRIPTION

Persons of ordinary skill in the art will realize that the following description is illustrative only and not in any way limiting. Other embodiments will readily suggest themselves to such skilled persons.

The present invention allows generation of temperature-stable clock using ordinary oscillators that do not have high stability of frequency with temperature, while maintaining low jitter performance. In accordance with the present invention, frequency stability results in the order of 300 parts per billion (ppb) over a temperature range of −40° C. to 85° C. with 0.2° C./minute temperature change can be achieved when using first and second XOs 14 and 16 each having frequency stabilities of from about 10 parts per million (ppm) to about 300 ppm disposed in the same package. For purposes of the present invention, a temperature stable clock signal is one having a frequency stability of no more than about 400 ppb. In accordance with the present invention, jitter on the order of 150 femtoseconds (fs) RMS can be achieved when using first and second XOs 14 and 16 disposed in the same package, each of which having jitter on the order of about 50 fs to about 150 fs RMS. For purposes of the present invention, a low-jitter output clock signal from a clock generating circuit is one having a maximum of about 250 fs RMS and, as disclosed herein, is achieved when employing a synthesizer to generate the output clock.

To achieve such high stability of frequency over temperature, the present invention can be implemented as part of synthesis firmware of timing devices, and is capable of generating clocks having any frequency. The present invention exploits the unique property that the frequency difference between two crystal oscillators (XOs) is linear with temperature to predict temperature behavior of one of the two oscillators over the temperature change. Each crystal oscillator is first characterized over temperature and then appropriate polynomial coefficients representing the characterization are stored to be used in the present invention. In particular, the polynomial coefficients are obtained by curve fitting of frequency variations of second XO 16 over temperature vs. frequency difference between first XO 14 and second XO 16 over temperature. A frequency difference between the two oscillators is passed to a relatively high bandwidth DPLL (in the order of about 20 Hz to about 100 Hz), and is being used with the stored polynomial coefficients to replicate the frequency drift over temperature of the second XO 16 that is used as a master clock. The replicated frequency drift over temperature will be used to compensate for the actual frequency drift over temperature. The master clock on line 28 is being used for synthesis of a clock to be programmed to output any frequency. Temperature changes to each of the two crystal oscillators (first XO 14 and second XO 16) cause a variation in the frequency of the output of each of the two crystal oscillators. The present invention predicts the temperature based variation of the second XO 16 that is used as the master clock based on a frequency difference between the two crystal oscillators and corrects the output clock frequency accordingly, thereby minimizing variation of output clock frequency with temperature changes. Using these ordinary XOs as described herein with jitter from about 50 to about 150 fs RMS allows synthesis of clock signals that have jitter below about 150 to about 250 fs RMS when employing a synthesizer to generate the output clock.

One useful application of the present invention is as a companion oscillator for Network Sync PLLs although the present invention can be extended as a replacement for a standalone TCXO or OCXO. The present invention replaces an expensive TCXO or OCXO using ordinary inexpensive XO crystal oscillators and provides a faster startup time and consumes less power than TCXOs or OCXOs.

The present invention can take advantage of programmable System on Chip (SoC) based PLL circuits to process ordinary oscillator signals and produces temperature stable clocks.

Referring first of all to FIG. 1, a block diagram shows a circuit 10 for generating temperature-stable low jitter clocks using ordinary oscillators in accordance with an aspect of the invention. The circuit 10 includes an oscillator module 12 which includes a first crystal oscillator (XO) 14 and a second XO 16 disposed in a single package. As will be appreciated by persons of ordinary skill in the art, each of first and second XO 14 and 16 is usually in the form of a module that includes a crystal, as well as a driver and decoupling capacitors (not explicitly shown). Each of the first and second XO 14 and 16 is capable of generating a clock with specific frequency and prescribed accuracy (on the order of 10 to 300 ppm). Frequency stability over temperature is an important property of oscillators that are used as clock sources for synthesizers that generate high temperature-stability clocks, and plain crystals do not have a great frequency stability over temperature (usually several hundreds of ppm over industrial temperature range: −40 C to 85 C). Temperature Controlled XOs (TCXOs) that usually have a temperature sensor and control circuit that corrects frequency variations due to temperature changes, and oven-controlled XOs (OCXOs) that have an oven to keep the XO's temperature constant, exhibit an improved stability over temperature. The present invention allows the use of crystal oscillators XO 14 and XO 16 while providing the output clock frequency stability over temperature that usually requires the use of TCXOs or OCXOs.

A clock generating circuit 18 includes first and second phase acquisition modules 20 and 22. The first phase acquisition module 20 receives the output of first XO 14 on line 24 and the second phase acquisition module 22 receives a reference clock signal from a reference clock source 26 (shown in dashed lines since it is external to the clock generating circuit 18 and provided by a user). The input reference clock source should have a frequency within telecom range (i.e., between about 0.5 Hz and 1 GHz) and be traceable to a primary reference source (e.g., atomic clock or GPS). The output of the clock generating circuit 18 is frequency and phase locked relative to the reference clock source 26 when the reference clock source 26 is present.

In accordance with an aspect of the invention, the master clock signal from the output of the second XO 16 on line 28 is used as base of comparison in the first and second phase acquisition modules 20 and 22. The first phase acquisition module 20 measures the phase difference between the output of the first XO 14 and the master clock on line 28 and outputs information regarding the measured phase difference. The second phase acquisition module 22 measures the phase difference between the output of the input reference clock source and the master clock on line 28 and outputs information regarding the measured phase difference. Circuits for providing this function are known in the art. In accordance with the present invention, the first and second phase acquisition modules 20 and 22 are capable of comparing an input clock signal with the master clock signal on line 28 even if the input clock signal and the master clock signal do not have the same nominal frequency. For example, the master clock signal on line 28 can be 20 MHz and the input reference clock signal can be at 19.44 MHz or 1.544 MHz or any frequency.

The master clock 28 provides the nominal frequency information for the first digital phase locked loop (DPLL) 30. The output of the first phase acquisition module 20 is presented to first DPLL 30 to lock it to the phase difference generated by the first phase acquisition circuit 20. The first DPLL 30 has a low pass transfer function with a relatively high bandwidth (a corner frequency in the range of between about 20 Hz to about 100 Hz). The output of the first DPLL 30 is frequency information that represents the frequency difference between the first XO 14 and the second XO 16. The master clock 28 also provides the nominal frequency information for the second DPLL 32. The output of the second phase acquisition module 22 is presented to the second DPLL 32 to lock it to the phase difference generated by the second phase acquisition circuit 22. The second DPLL 32 has a low pass transfer function with a relatively low bandwidth (a corner frequency in the range of between about 0.001 Hz to about 0.3 Hz).

The frequency information representing the frequency difference between the first XO 14 and the second XO 16 at the output of the first DPLL 30 is presented to the XO variation Estimator 34. The XO variation estimator 34 is a module that estimates frequency variations of the master clock signal output on line 28 from second XO 16 and provides the estimated frequency variation information to the second DPLL 32 to correct the output frequency of second DPLL 32 such that frequency variation of the master clock signal output on line 28 from second XO 16 due to temperature changes is negated.

The input of the XO variation estimator 34 is the frequency information representing the frequency difference between the first XO 14 and the second XO 16 that was provided by the phase acquisition module 20 and passed through the first DPLL 30. The high bandwidth of the first DPLL 30 provides a fast response to changes in frequency difference due to abrupt temperature changes. The XO variation estimator 34 includes a multiplier 36 that multiplies the frequency difference information from the first DPLL 30 with polynomial coefficients that were generated during initial production and characterization of the package containing the XOs 14 and 16 and are stored in a memory 38. In some embodiments of the invention, the memory 38 may be a non-volatile memory (NVM) or a one-time-programmable (OTP) memory and in some embodiments of the invention, the memory 38 may be included in the package 12 that includes the first XO 14 and the second XO 16. The polynomial coefficients are obtained by curve fitting of frequency variations of second XO 16 over temperature vs. frequency difference between first XO 14 and second XO 16 over temperature. In embodiments of the invention where a Microchip Vectron PX-502-0002-24M576 24.576 MHz dual XO package 12 is used, the frequency difference between the two XOs happens to be linear with temperature changes.

The second DPLL 32 includes a phase detector (PFD) 40 (implemented as, e.g., a subtractor), a loop filter 42, a frequency subtractor 46 and a digitally controlled oscillator (DCO) 44 (which in some embodiments may be a software DCO (SDCO)). The phase detector 40 together with the loop filter 42 converts the phase difference between the reference clock source 26 and the master clock 28 into frequency information related to a frequency difference between the reference clock source 26 and the master clock 28 in the presence of the reference clock signal. The second DPLL 32 has the ability to subtract frequency between loop filter 42 and the XO Variation estimator 34 through the frequency subtractor 46. The output of loop filter 42 is fed to a first input of frequency subtractor 46, and an output of the XO variation estimator 34 is fed to a second input of frequency subtractor 46. By subtracting the output of the XO variation estimator 34 from the output of the loop filter 42, any variations in frequency of master clock signal on the master clock signal output line 28 as a result of temperature changes are compensated for. When the reference clock 26 is present, the output of the clock generating circuit 18 follows the reference clock and the compensation provided by the frequency subtractor 46 will minimize any drift of the output clock 48 due to changes in the master clock caused by temperature changes, i.e., minimizing wander generation of the output of the clock generating circuit 18. When the reference clock signal is no longer present the output of the loop filter 42 is solely dependent on the master clock 28 and will have all of the frequency variations over temperature exhibited by the master clock 28. These frequency variations are compensated for in the frequency subtractor 46 to improve holdover temperature stability of the clock generating circuit 18.

The loop filter 42 is a module which mainly determines the transfer function of the second DPLL 32—or loop bandwidth (the transfer function of second DPLL 32 is affected by other modules such the DCO 44 as well, but these are considered non-changeable and are usually ignored for purpose of specifying loop bandwidth). The loop filter 42 is preferably a low pass filter with 3 dB attenuation point at the specified bandwidth frequency. It usually has $1^{st}$ or $2^{nd}$ order low pass characteristics.

The DCO 44 may be implemented in software in some embodiments. The DCO 44 typically consists of an accumulator with a Frequency Control Word (FCW) from a programmable register internal to the DCO as its input, as is well known in the art. The FCW determines the nominal frequency of the clock at the DCO output. Besides the FCW, DCO 44 includes another control input for fine tuning of the DCO output frequency, and that input is shown in FIG. 1 as being driven by the output of the frequency subtractor 46. The output of the DCO 44 is thus a temperature compensated output clock signal that can be used as the output 48 of the clock generating circuit 18 via dashed line connection 50 when an optional synthesizer 52 is not used.

The output of the DCO 44 can optionally be presented to the synthesizer 52 shown in dashed lines. The synthesizer 52 is a module that synthesizes an output clock signal from the master clock on line 28 at a desired frequency on clock output line 48. The desired output clock signal is phase and frequency locked to the output of the DCO 44. In essence, synthesizer 52 performs low jitter frequency conversion between the master clock signal on line 28 and a desired output frequency, allowing any frequency within the telecom range (e.g., between about 0.5 Hz and about 1 GHz) having low phase noise (low jitter) to be generated on its output at clock output line 48. The phrase "any frequency" as used herein shall be construed to mean any frequency within the telecom range (e.g., between about 0.5 Hz and about 1 GHz).

In embodiments where the DCO 44 is configured as a hardware element, the present invention provides a frequency output from either the DCO 44 or the optional synthesizer 52 that is highly frequency stable over temperature change, using ordinary oscillators that do not have high stability of frequency with temperature. When the DCO 44 is implemented as a software DCO (SDCO), the present invention provides a clock output from the synthesizer 52.

The master clock signal from second XO 16 on line 28 is connected to, and drives, every internal block in circuit 18. The master clock signal on line 28 is connected to the synthesizer 52 when it is used in the circuit. The output clock 48 is always dependent on the master clock because it is directly synthesized from the master clock on line 28 using either the synthesizer 52 or the hardware form of the DCO 44. In embodiments where the output clock 50 is driven by the synthesizer 52, fine frequency control of the synthesizer 52 related to phase and frequency differences between the reference clock source 26 and the master clock 28 is performed by the output of the DCO 44. When the reference clock source 26 is no longer present, the fine frequency control of the synthesizer 52 by the DCO 44 is related to frequency variations in the master clock 28 caused by temperature fluctuations as compensated for by the XO variation estimator 34. In embodiments of the invention that do not employ the synthesizer 52, the present invention provides the high frequency stability over temperature as disclosed herein but does not provide low enough jitter required by most telecom applications. Use of a conventional synthesizer will provide the low jitter as disclosed herein.

Once the DPLL 32 is locked to the reference clock source 26 by using the second phase acquisition circuit 22, the output clock 48 will have stability inherited from the input reference clock source 26. Using the present invention, temperature variations of the master clock signal on line 28 coming from second XO 16 will be removed, minimizing wander generation of the output clock 48. In the event that the reference clock source 26 is no longer present, the stability of the output on clock output line 48 is determined only by the stability of the master clock signal on line 28. Using the present invention, temperature variations of the master clock signal on line 28 coming from second XO 16 will be removed, allowing the output clock 48 to have good stability even in the absence of the reference clock source 26.

Referring now to FIG. 2, a flow diagram shows an illustrative method 60 for generating temperature-stable low jitter clocks using ordinary oscillators in accordance with an aspect of the invention. The method begins at reference numeral 62.

At reference numeral 64, first and second crystal oscillators are provided. In some embodiments of the invention, the first and second crystal oscillators may be disposed together in the same package.

At reference numeral 66, a memory (e.g., in the same package as the first and second crystal oscillators) is provided that stores temperature characterization polynomial coefficients generated during initial production and characterization of the first and second crystal oscillators obtained by curve fitting frequency variations of the second crystal oscillator over temperature vs. frequency differences between the first and second crystal oscillators over temperature.

At reference numeral 68, the phase difference between the first crystal oscillator and the second crystal oscillator is measured, for example in a first phase acquisition circuit. At reference numeral 70, a high-bandwidth first digital phase locked loop (DPLL) is phase locked to the measured phase difference between the first crystal oscillator and the second crystal oscillator.

At reference numeral 72, frequency variations of the second crystal oscillator are estimated responsive to the frequency difference information representing the frequency difference between the first crystal oscillator and the second crystal oscillator, and responsive to temperature characterization of the second crystal oscillator frequency vs. the frequency difference between first crystal oscillator and second crystal oscillator over temperature.

At reference numeral 74, a reference clock signal is provided to the clock generating circuit.

At reference numeral 76, the phase difference between the reference clock signal and the second crystal oscillator is measured, for example, in a second phase acquisition circuit.

At reference numeral 78, a second DPLL is phase locked to the phase difference between the reference clock signal and the second crystal oscillator. At reference numeral 80, the frequency of the second DPLL is adjusted (e.g., using frequency subtractor) by the estimated frequency variation over temperature of the second crystal oscillator (obtained by, e.g., the XO variation estimator). At reference numeral 82, the output of the second DPLL is provided as a clock output.

At reference numeral 84 the output of the second DPLL can optionally be provided to a frequency synthesizer to provide the ability to generate a low-jitter clock output with a desired frequency. The method ends at reference numeral 86.

Since clock generating circuits can generate a clock having any frequency within the telecom range based on the master clock signal on line 28, the present invention allows generation of temperature-stable clocks of any frequency. The present invention provides a clock stability comparable to that achieved using temperature compensated crystal oscillators as a master clock for the same clock generating circuits. The present invention offers a cost-effective solution in generating temperature-stable, any frequency clocks using two inexpensive oscillators as opposed to using significantly more expensive TCXO or oven-controlled crystal oscillator (OCXO). Furthermore, prior art applications that require both, high stability of frequency and good jitter, needed to use very expensive low jitter TCXO or OCXO. The solution provided by the present invention meets both low jitter and temperature stability requirements using two ordinary oscillators, which is significantly less expensive than the two above-described prior art solutions. The present invention can be further expanded to be used with any two oscillating devices, whose frequency difference has a fixed, well defined, relationship to temperature change, if the change can be measured and characterized to produce appropriate polynomial coefficients. Such oscillating devices can be, but are not limited to, Micro-Electro-Mechanical Systems (MEMS).

The invention can be employed in frequency synthesis firmware, employing one additional PLL (first DPLL 30) for correcting frequency variations over temperature. The frequency difference between the two crystal oscillators is then measured using existing hardware (first and second phase acquisition circuits 20 and 22) in clock generating circuits and the frequency difference is then passed to the first DPLL 30 which is used to perform compensation of frequency due to master clock frequency variations due to temperature variations. Polynomial coefficients for replicating one of the oscillator temperature variations vs. frequency difference between the two oscillators can be stored in a small memory (OTP, EEPROM or Flash) during characterizations of the oscillators.

The present invention allows for packaging using different groupings of components. The two crystal oscillators (or resonators) can be packaged together with drivers and the small memory in one package. The master clock signal on line 28 of the second XO 16 of the dual-oscillator (dual XO) device is fed to the oscillator input of the synthesizer 52 and the output of the first XO 14 on line 24 is fed to one of the inputs of the first phase acquisition circuit 20. This solution requires relatively simple dual XO temperature characterization to get the required polynomial coefficients.

In another variation, multiple dies of clock generating circuits, including non-volatile memory, along with resonators and passive components can be disposed in one package. Polynomial coefficients can be stored in the non-volatile memory used for other processor code storage. The solution is compact, but comes with the challenge of characterizing oscillators over multiple temperature points due to the high cost of testers required for testing complex packages that include clock generating circuits employing multiple dies having larger numbers of I/O pins as compared to testers used for XOs TCXOs, or OCXOs having four to six I/O pins, many more of which can be mounted on a single test board for test.

In another variation, a pre-packaged and characterized dual XO, containing a small memory for coefficients are packaged together with clock generating circuit dies in one package. This is a compact solution, requiring a simple characterization procedure for the crystal oscillators but adds complexity to packaging as the pre-packaged dual XO is not small enough to easily fit in another package.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for generating a temperature-stable clock comprising:
   a first crystal oscillator;
   a second crystal oscillator;
   an input for a reference clock source;
   a clock output;
   a first phase acquisition circuit coupled to an output of the first crystal oscillator and to an output of the second crystal oscillator;
   a second phase acquisition circuit coupled to the input for the reference clock source and to an output of the second crystal oscillator;
   a first digital phase locked loop (DPLL) coupled to an output of the first phase acquisition circuit;
   a crystal oscillator variation estimator coupled to an output of the first DPLL; and
   a second DPLL coupled to an output of the second phase acquisition circuit, the second DPLL including:
      a phase-frequency detector having a first input coupled to the output of the second phase acquisition circuit;
      a loop filter;
      a frequency subtractor having a first input coupled to an output of the loop filter and a second input coupled to an output of the crystal oscillator variation estimator; and
      a digital controlled oscillator (DCO) coupled to an output of the frequency subtractor, an output of the DCO coupled to a second input of the phase-frequency detector and coupled to the clock output.

2. The circuit of claim 1 further comprising a synthesizer coupled to the output of the DCO and driving the clock output.

3. The circuit of claim 1 wherein the DCO is a software DCO.

4. The circuit of claim 1 wherein the first crystal oscillator and the second crystal oscillator are disposed in a single package.

5. The circuit of claim 1 wherein the crystal oscillator variation estimator includes a multiplier having one input coupled to the output of the first DPLL and a second input coupled to a memory storing polynomial coefficients generated during initial production and characterization of the first and second crystal oscillators obtained by curve fitting of frequency variations of the second crystal oscillator over temperature versus frequency differences between the first and second crystal oscillators.

6. The circuit of claim 5 where the memory is one of a non-volatile memory and a one-time-programmable memory.

7. The circuit of claim 5 wherein the first crystal oscillator, the second crystal oscillator, and the memory are disposed in a single package.

8. The circuit of claim 1 wherein the crystal oscillator variation estimator includes a multiplier having one input coupled to the output of the first DPLL and a second input coupled to a memory storing polynomial coefficients generated during initial production and characterization of the first and second crystal oscillators obtained by curve fitting of frequency variations of the second crystal oscillator over temperature versus frequency differences between the first and second crystal oscillators.

9. The circuit of claim 1 wherein the first DPLL is a high bandwidth DPLL and the second DPLL is a low bandwidth DPLL.

10. The circuit of claim 1 wherein the loop filter has one of $1^{st}$ and $2^{nd}$ order low pass characteristics.

11. A method for generating temperature-stable clocks comprising:
   providing first and second crystal oscillators;
   providing a memory that stores temperature characterization polynomial coefficients generated during initial production and characterization of the first and second crystal oscillators obtained by curve fitting frequency variations of the second crystal oscillator over temperature versus frequency differences between the first and second crystal oscillators over temperature;

measuring the phase difference between the first crystal oscillator and the second crystal oscillator;

phase locking a high-bandwidth first digital phase locked loop (DPLL) to the measured phase difference between the first crystal oscillator and the second crystal oscillator;

estimating frequency variations of the second crystal oscillator responsive to frequency information based on the measured phase difference, and responsive to the stored temperature characterization polynomial coefficients;

providing a reference clock signal from a reference clock source;

measuring the phase difference between the reference clock signal and the second crystal oscillator;

phase locking a second DPLL to the phase difference between the reference clock signal and the second crystal oscillator;

adjusting the frequency of the second DPLL by the estimated frequency variation of the second crystal oscillator; and providing an output from the second DPLL.

12. The method of claim 11 further comprising providing the output of the second DPLL to a frequency synthesizer.

13. The method of claim 11 wherein the providing first and second crystal oscillators comprises providing first and second crystal oscillators in the same package.

14. The method of claim 11 wherein the measuring the phase difference between the first crystal oscillator and the second crystal oscillator comprises measuring the phase difference between the first crystal oscillator and the second crystal oscillator in a first phase acquisition circuit.

15. The method of claim 11 wherein the measuring the phase difference between the reference clock signal and the second crystal oscillator comprises measuring the phase difference between the reference clock signal and the second crystal oscillator in a second phase acquisition circuit.

16. The method of claim 11 wherein the adjusting the frequency of the second DPLL by the estimated frequency variation over temperature of the second crystal oscillator comprises adjusting the frequency of the second DPLL using a frequency subtractor circuit.

17. The method of claim 11 wherein providing the output of the second DPLL comprises providing the output of the second DPLL from a digitally controlled oscillator in the second DPLL.

18. The method of claim 17 further comprising providing the output of the digitally controlled oscillator to a synthesizer.

* * * * *